US007750297B1

(12) United States Patent
Chow et al.

(10) Patent No.: US 7,750,297 B1
(45) Date of Patent: Jul. 6, 2010

(54) CARBON NANOTUBE COLLIMATOR FABRICATION AND APPLICATION

(75) Inventors: Lee Chow, Orlando, FL (US); Guangyu Chai, Orlando, FL (US); Thomas Schenkel, San Francisco, CA (US)

(73) Assignees: University of Central Florida Research Foundation, Inc., Orlando, FL (US); The Regents of the University of California, Oakland, CA (US)

( * ) Notice: Subject to any disclaimer, the term of this patent is extended or adjusted under 35 U.S.C. 154(b) by 562 days.

(21) Appl. No.: 11/716,258

(22) Filed: Mar. 9, 2007

(51) Int. Cl.
*H01J 37/26* (2006.01)
*G21K 5/04* (2006.01)

(52) U.S. Cl. ....................... 250/311; 250/306; 250/307; 250/492.3; 977/734; 977/742; 977/840; 977/842; 977/849

(58) Field of Classification Search ................. 250/306, 250/307, 309, 310, 311, 492.1, 492.3, 396 R; 977/700, 734, 742, 743, 745, 750, 752, 840, 977/842, 847, 849, 850, 881, 947, 949, 950; 423/414, 417, 420.2, 445 R, 446, 447.2, 447.3, 423/447.4
See application file for complete search history.

(56) References Cited

U.S. PATENT DOCUMENTS

| | | | | |
|---|---|---|---|---|
| 4,025,689 | A | 5/1977 | Kobayashi et al. | 428/402 |
| 4,228,142 | A | 10/1980 | Holcombe, Jr. et al. | 423/449 |
| 4,855,091 | A | 8/1989 | Genus et al. | 264/22 |
| 5,165,909 | A | 11/1992 | Tennent et al. | 423/447.3 |
| 5,346,683 | A | 9/1994 | Green et al. | 423/447.2 |
| 5,456,986 | A | 10/1995 | Magetich et al. | 428/403 |
| 5,543,378 | A | 8/1996 | Wang | 502/174 |
| 5,560,898 | A | 10/1996 | Uchida et al. | 423/461 |
| 5,641,466 | A | 6/1997 | Ebbesen et al. | 423/447.2 |
| 5,698,175 | A | 12/1997 | Hiura et al. | 423/447.1 |
| 5,747,161 | A | 5/1998 | Iijima | 428/367 |
| 5,780,101 | A | 7/1998 | Nolan et al. | 427/216 |
| 5,965,267 | A | 10/1999 | Nolan et al. | 428/408 |
| 6,159,538 | A | 12/2000 | Rodriguez et al. | 427/213.31 |
| 6,331,209 | B1 | 12/2001 | Jang et al. | 117/90 |
| 6,350,488 | B1 | 2/2002 | Lee et al. | 427/249.1 |
| 6,413,487 | B1 | 7/2002 | Resasco et al. | 423/447.3 |
| 6,455,021 | B1 | 9/2002 | Saito | 423/447.3 |

(Continued)

OTHER PUBLICATIONS

"Channeling of high-energy particles in a multi-wall nanotube", S. Bellucci et al., posted on www.arxiv.org on Jan. 3, 2005.*

(Continued)

*Primary Examiner*—David A Vanore
*Assistant Examiner*—Nicole Ippolito Rausch
(74) *Attorney, Agent, or Firm*—Brian S. Steinberger; Phyllis K. Wood; Law Offices of Brian S. Steinberger, P.A.

(57) ABSTRACT

Apparatus, methods, systems and devices for fabricating individual CNT collimators. Micron size fiber coated CNT samples are synthesized with chemical vapor deposition method and then the individual CNT collimators are fabricated with focused ion beam technique. Unfocused electron beams are successfully propagated through the CNT collimators. The CNT nano-collimators are used for applications including single ion implantation and in high-energy physics, and allow rapid, reliable testing of the transmission of CNT arrays for transport of molecules.

13 Claims, 5 Drawing Sheets

U.S. PATENT DOCUMENTS

| | | | | |
|---|---|---|---|---|
| 6,479,028 | B1 | 11/2002 | Kaner et al. | 423/414 |
| 6,582,673 | B1 | 6/2003 | Chow et al. | 423/445 |
| 2004/0061051 | A1 * | 4/2004 | Schneiker et al. | 250/306 |
| 2004/0232353 | A1 * | 11/2004 | Jamieson et al. | 250/492.1 |
| 2004/0245464 | A1 * | 12/2004 | Iwasaki et al. | 250/307 |
| 2008/0217531 | A1 * | 9/2008 | Muray et al. | 250/307 |
| 2009/0220561 | A1 * | 9/2009 | Jin et al. | 424/423 |

OTHER PUBLICATIONS

Iijima S. "Helical Microtubules of Graphitic Carbon" *Nature* (London) vol. 354, pp. 56-58. (1991).

Krasheninnikov A. V. & Nordlund K., "Multiwalled Carbon Nanotubes as Apertures and Conduits for Energetic Ions" *Phys. Rev. B*, vol. 71, pp. 245408-1-245408-4 (2005).

Zhou D. P., Song Y. H., Wang Y. N., & Miskovic Z. L. "Coulomb Explosions and Stopping of Molecular Ions Channeled Through Caron Nanotubes" *Phys. Rev. A*, vol. 73, pp. 033202-1-033202-5, (2006).

Bellucci S., Biryukov V. M., Chesnokov Y. A., Guidi V., & Scandale W. "Channeling of High Energy Beams in Nanotubes"*Nucl. Instrum. Methods Phys Res. B*, vol. 202, pp. 236-241 (2003).

Moura C. S. & Amaral L. "Channeling on Carbon Nanotubes: A Molecular Dynamics Approach" *J. Phys. Chem. B*, vol. 109, pp. 13515-13518 (2005).

Kruger A., Ozawa M., & Banhart F. Carbon Nanotubes as Elements to Focus Electron Beams by Fresnel Diffraction:, *Appl. Phys. Lett.* vol. 83, pp. 5056-5058 (2003).

Kleckley S, Chai G. Y., Zhou D., Vanfleet R., & Chow L. "Fabrication of multilayered nanotube probe tips". Carbon (2003) vol. 41, pp. 833-836.

Chai G., Chow L., Zhou D., & Byahut S. R. "Focused-ion-beam Assisted Fabrication of Individual Multiwall Carbon Nanotube Field Emitter" *Carbon*, vol. 43, pp. 2083-2087. (2005).

Chai G., Heinrich H., Chow L., & Schenkel T. "Electron Transport Through A Single, Well Aligned Carbon Nanotube" Submitted to Science 3 pages, (2007).

Persaud A., Park S. J., Liddle J. A., Rangelow I. W., Bokor J., & Schenkel T. "Integration of Scanning Probes and Ion Beams" *NanoLetters*, vol. 5, No. 6, pp. 1087-1091 (2005).

* cited by examiner

CARBON NANOTUBE COLLIMATOR FABRICATION AND APPLICATION

STATEMENT OF GOVERNMENTAL SUPPORT

The invention described and claimed herein was made in part utilizing funds supplied by the U.S. Department of Energy under Contract No. DE-AC02-05CH11231. The Government has certain rights in this invention.

FIELD OF THE INVENTION

This invention relates to carbon nanotubes and, in particular, to methods, systems, apparatus and devices for fabricating carbon nanotube collimators for use for applications where a narrow, well-collimated beam of charged particles is required such as use for single ion implantation, as nano-aperture for single ion implementation for quantum computers, high-energy physics including $e^{31}$-$e^{+}$ collision or $p^{-}$-$p^{+}$ collision, and rapid, reliable testing of the transmission of CNT arrays for transport of molecules.

BACKGROUND AND PRIOR ART

The hollow structure is a remarkable feature of carbon nanotubes (CNTs) as described in Iijima S., Nature (London) 354, pp. 56-8 (1991) since it provides a significant chance to use the carbon nanotubes for the channeling of high energy charged particles and associated channeling radiation. In particular, theoretical studies of particle channeling through CNTs have recently demonstrated that a particle beam channeled in a nanotube could be efficiently steered in the way similar to crystal channeling, which could be used as small nanobeams for biological studies and medical therapy. See Krasheninnikov A. V. & Nordlund K. Phys. Rev. B 71, 245408 (2005); Zhou D. P., Song Y. H., Wang Y. N., & Miskovic Z. L. Phys. Rev. A 73, 033202 (2006); Bellucci S., Biryukov V. M., Chesnokov Y. A., Guidi V., & Scandale W. Nucl. Instrum. Methods Phys Res. B 202 pp. 236-241 (2003); and Moura C. S. & Amaral L. J. Phys. Chem. B 109, pp. 13515-13518 (2005).

However, the nano size of the CNTs makes it difficult to precisely control the position and the orientation of the CMT. As a result, the experimental feasibility of channeling through CNTs has not been demonstrated. Only one research group from Germany is known to have worked on observing very short (15-60 nm) multiwall CNTs in the normal direction under conventional TEM as described in Kruger A., Ozawa M., & Banhart F. Appl. Phys. Lett. 83, pp. 5056-5058 (2003).

Since multi-wall carbon nanotubes are flexible and usually bent, it is necessary to produce short and straight nanotubes that can be aligned perfectly with their axes along the electron beam. Stolterfoht et al. in Germany achieved this goal by the following two ways: (i) Multiwall CNTs from the cathode deposit in an arc-discharge were embedded in epoxy and cut normal to their axes in an ultramicrotome with a diamond knife into slices of approximately 60 nm in thickness; and (ii) very short multiwall CNTs with lengths of 15-20 nm were produced with an arc discharge between two graphite electrodes operated under water. They successfully examined the short CNTs from the axial direction under conventional TEM and observed the evidence for a Fresnel diffraction effect. From their CNT sample preparation process it is clear that their CNT channel is randomly oriented and the CNT channel has to be extremely short (less than 100 nm) to be appeared straight for the transmission electron microscopy (TEM) observation. This made fabrication of individual CNT collimators impossible.

Recently a chemical vapor deposition synthesis of a monolithic multiwall carbon nanotube with a graphitic shield was described in Kleckley S, Chai G. Y., Zhou D., Vanfleet R., & Chow L., Fabrication of multilayered nanotube probe tips, Carbon 2003; 41: pp. 833-6. This unique structure of fiber coated CNT (F-CNT) is ideal for the CNT channeling experiments. With recently developed focused ion beam (FIB) assisted CNT device fabrication technique described by Chai G., Chow L., Zhou D., & Byahut S. R. Carbon 43, 2083-7. (2005), co-inventors of the present invention successfully fabricated two individual CNT collimators with inner diameters both about 20 nm and CNT column lengths 700 nm and 3 micron respectively.

The F-CNT structure makes the alignment of the CNT core straightforward by manipulating the micron size carbon fiber. The fiber shield also provides protection for the incident beam damage to the CNT from the focused ion beam (FIB) fabrication process. Unfocused electron beams are successfully propagated through the CNT collimators in a conventional TEM instrument as described in a paper by Chai G., Heinrich H., Chow L., & Schenkel T., submitted to Science (2007). The Fresnel diffraction phenomenon was observed and by tilting the F-CNT package with 1 degree the CNT channel is optically blocked. However, some electron transmission through the CNT core was observed, clear evidence of the electron channeling through the CNT column.

The demonstration of efficient electron transport through a single, micrometer long, and well aligned carbon nanotube has the potential to realize new classes of collimators and beam optics for energetic particles—ions as described in Persaud A., Park S. J., Liddle J. A., Rangelow I. W., Bokor J., & Schenkel T. NanoLetters 5, 1087 (2005), as well as electrons. The use of fiber coated carbon nanotubes makes the handling of single tubes robust and compatible with standard micromanipulation techniques, and testing that a tube is really open with widely available TEMs enables transmission and material transport experiments through CNTs with much higher rates of reproducibility and less frustration then previously possible.

SUMMARY OF THE INVENTION

A primary objective of the invention is to provide new apparatus, methods, systems and devices for fabricating individual CNT collimators.

A secondary objective of the invention is to provide new apparatus, methods, systems and devices using micron size fiber coated CNT samples that are synthesized using a chemical vapor deposition method and focused ion beam technique is used to produce the individual CNT collimators.

A third objective of the invention is to provide new methods, systems, apparatus and devices for fabricating individual CNT collimators, wherein unfocused electron beams are successfully propagated through the CNT collimators.

A forth objective of the invention is to provide new methods, systems, apparatus and devices for fabricating individual CNT collimators for applications such as single ion implantation and in high-energy physics, and may allow rapid, reliable testing of the transmission of CNT arrays for transport of molecules.

A fifth objective of the invention is to provide new apparatus, methods, systems and devices for fabricating individual CNT collimators for use as nano-aperture for single ion implementation for quantum computers.

A sixth objective of the invention is to provide new apparatus, methods, systems and devices for fabricating individual CNT collimators for applications where a narrow, well-collimated beam of charged particles is required.

A seventh objective of the invention is to provide new apparatus, methods, systems and devices for fabricating individual CNT collimators for application in high energy physics including $e^{-}$-$e^{+}$ collision or $p^{-}$-$p^{+}$ collision experiments.

A first preferred embodiment of the invention provides a method for producing a carbon nanotube collimator. The steps include providing a fiber coated carbon nanotube sample on a substrate, detaching the carbon nanotube sample from the substrate to produce the CNT collimator, moving the detached CNT collimator to a transmission electron microscopy grid using a micro-manipulator, attaching the CNT collimator to a transmission electron microscopy grid, and using a low ion beam current to thin down the CNT collimator to a predetermined CNT collimator channel length and to clean a CNT collimator surface.

The step of providing the fiber coated carbon nanotube includes identifying a fiber having a carbon nanotube core on a substrate and using focused ion beam induced chemical vapor disposition to deposit a platinum metal on the fiber coated carbon nanotube to stabilize the fiber coated carbon nanotube. The steps of detacing the fiber coated carbon nanotube includes partially detaching the fiber coated carbon nanotube from the substrate, attaching a micro-manipulator needle to the fiber coated carbon nanotube, and detaching the fiber coated carbon nanotube from the substrate to produce a CNT collimator sample.

Attaching the carbon nanotube collimator includes moving the detached carbon nanotube collimator to a transmission electron microscopy grid using a micro-manipulator, aligning a normal direction of the transmission electron microscopy grid is pre-with the carbon nanotube collimator; depositing a metal to secure the carbon nanotube collimator on the transmission electron microscopy grid to secure the carbon nanotube collimator, and detaching the micro-manipulator needle from the carbon nanotube collimator.

Further objects and advantages of this invention will be apparent from the following detailed description of preferred embodiments which are illustrated schematically in the accompanying drawings.

DESCRIPTION OF THE PREFERRED EMBODIMENTS

Figure 1A:
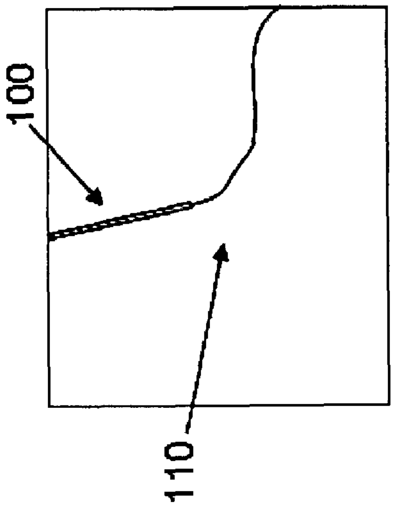
FIG. 1*a* shows a fiber coated carbon nanotube sample on a silicon substrate.

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

The following is a list of the reference numbers used in the drawings and the detailed specification to identify components:

100 carbon nanotube
110 substrate
120 trench
130 CNT side
135 CNT bottom
140 micromanipulator needle
150 transmission electron microscopy grid
200 CNT collimator sample It would be useful to provide abbreviations used herein before discussing the fabrication and use of the carbon nanotube collimators of the present invention including:

CNT carbon nanotube

CVD chemical vapor disposition

F-CNT fiber coated carbon nanotube

FIB focused ion beam

TEM transmission electron microscopy

Carbon nanotubes (CNT), with their hollow channel along the axis, are ideal collimators for the formation of nanobeams of charged particles, and they allow transport of neutral molecules for delivery to specific locations. The present invention shows that a focused ion beam (FIB) technique can be used to fabricate carbon nanotube collimators and the channeling of electron beam through carbon nanotube collimator is we experimentally verified. This nano-collimator may have important applications in single ion implantation, high energy physics, and as a production and screening tool for integration of CNT based drug delivery systems.

Previously, co-inventors of the present invention developed a chemical vapor deposition (CVD) process to produce supported carbon nanotubes that formed the core of carbon fibers, now U.S. Pat. No. 6,582,673 issued to Chow et al. on Jun. 24, 2003. This coaxial-cable like carbon fiber has a length of 30-100 μm, and a diameter of 1 μm. The diameter of the nanotube core is about 20-30 nm, with a hollow channel of 10-20 nm (smaller cores with diameters of only a few nm can also be formed). The Focus Ion Beam (FIB) technique described and illustrated in co-pending U.S. patent application Ser. No. 10/961,929 filed on Oct. 8, 2004 by Lee Chow et al., a co-inventor of this patent application is used in the apparatus, methods systems and devices of the present invention to fabricate carbon nanotube (CNT) collimators. This referenced patent is fully incorporated herein by reference thereto.

Figure 4:
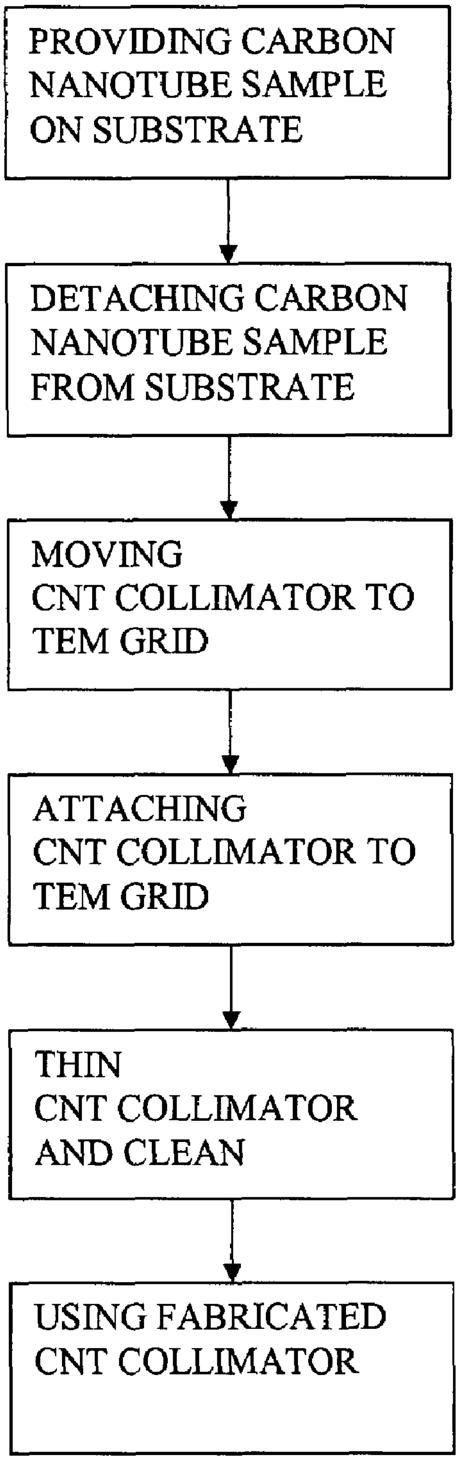
FIG. 4 is a flow diagram showing the steps for fabricating a CNT collimator.

The present invention provides apparatus methods, systems and devices for carbon nanotube collimator fabrication and applications for use. FIG. 4 is a process flow diagram showing the steps for fabricating carbon nanotube collimators. First, a fiber having a carbon nanotube core, referred to as a fiber coated carbon nanotube (F-CNT) 100, is identified on a silicon Si substrate 110 in a Vectra 200 focused ion beam system developed by FEI Company as shown in FIG. 1*a*.

Figure 1B:
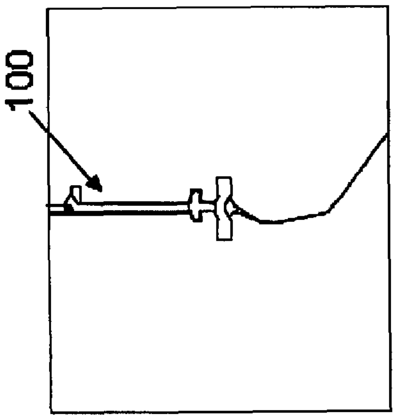
FIG. 1*b* shows the fiber coated carbon nanotube sample after focused ion beam induced chemical vapor disposition of platinum on sample.
Figure 1C:
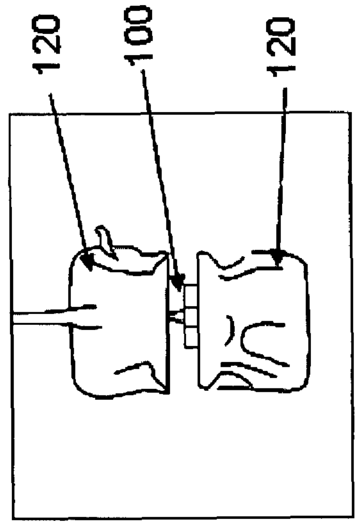
FIG. 1*c* shows focused ion beam milling to prepare a deep trench on each side of the sample.
Figure 1D:
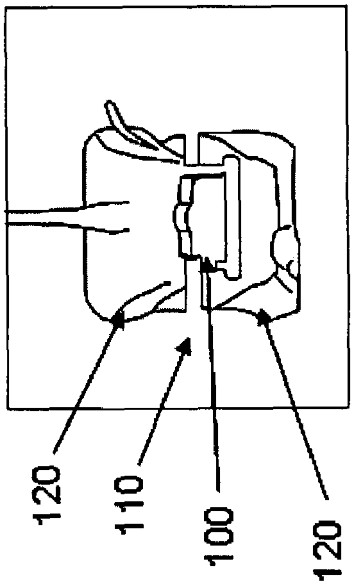
FIG. 1*d* shows the sample partially cut from the silicon substrate.
Figure 5:
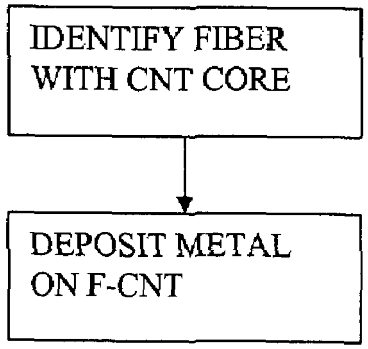
FIG. 5 is a flow diagram showing the steps for providing a fiber coated carbon nanotube on a substrate for use in fabricating the CNT collimator.
Figure 6:
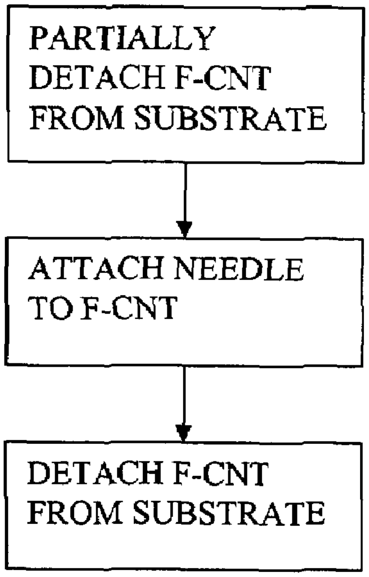
FIG. 6 is a flow diagram showing the steps for detaching the CNT collimator from the substrate.

FIG. 5 is a flow diagram showing the steps for providing a fiber coated carbon nanotube on a substrate for use in fabricating the CNT collimator. Once the F-CNT 100 is identified, platinum Pt metal is deposited using focused ion beam FIB induced chemical vapor disposition to stabilize the fiber coated carbon nanotube sample 100 as shown in FIG. 1*b* to protect the sample during focus ion beam ion milling. As shown in FIG. 6, once the sample is protected, the focus ion beam high current ion milling used for bulk removal of substrate material is applied to prepare two deep trenches 120, one on each side of the F-CNT sample 100 as shown in FIG. 1*c*, then the F-CNT sample 100 is partially cut from the silicon substrate as shown in FIG. 1*d*. As shown, the F-CNT side 130 and base 135 are cut away from the silicon 110.

Figure 1E:
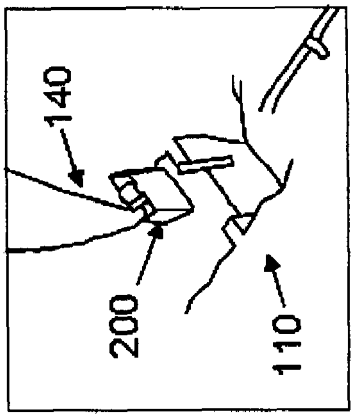
FIG. 1*e* shows a micromanipulator needle attached to the sample as the sample is removed from the substrate.

FIG. 1*e* shows the micro-manipulator needle 140 attached to the F-CNT sample 100 as the F-CNT sample 100 is removed from the substrate 110. In the preferred embodiment, the substrate 110 containing the F-CNT sample 100 is rotated approximately 45 degrees and titled approximately 45 degrees to prevent the micro-manipulator and the Pt gas delivery needle from touching the sample 100. Then, with careful manipulation, the in-situ micro-manipulator needle 140 is directed, electronically, to touch the F-CNT sample. Once in contact, chemical vapor disposition assisted platinum disposition is used to weld the needle 140 and the F-CNT sample 110 together. After the needle 140 is welded to the sample 100, focus ion beam milling is used to cut the CNT collimator sample 200 from the substrate 110.

Figure 1F:
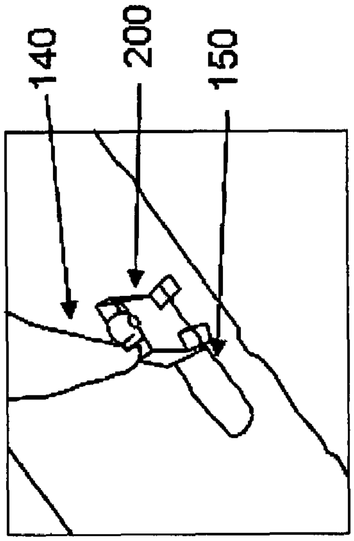
FIG. 1*f* shows the sample in contact with a transmission electron microscopy grid as the sample platinum is deposited to secure the sample to the transmission electron microscopy grid.
Figure 7:
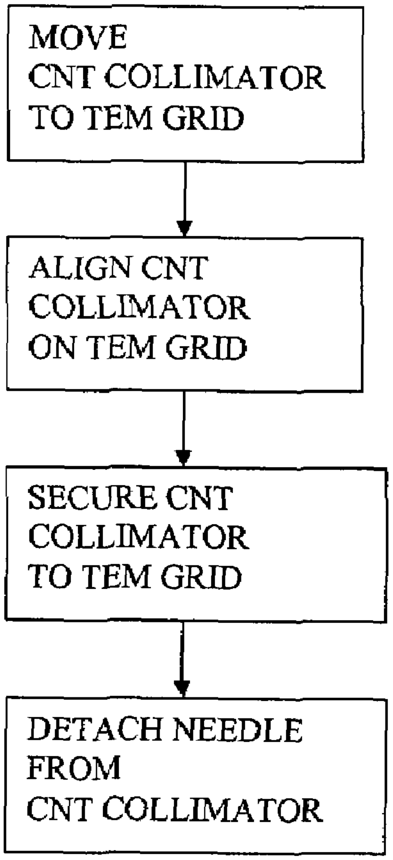
FIG. 7 is a flow diagram showing the steps for attaching the CNT collimator from FIG. 4 to a transmission electron microscopy grid.

The CNT collimator sample 200 is moved to the inner side of a transmission electron microscopy (TEM) grid 150 as shown in the process flow diagram of FIG. 7. FIG. 1*f* shows the CNT collimator sample 200 in contact with the TEM grid 150 as platinum metal is deposited to secure the sample 100 to the transmission electron microscopy grid 150. The normal direction of the TEM grid 150 is pre-aligned with the CNT collimator sample 200.

Figure 1I:
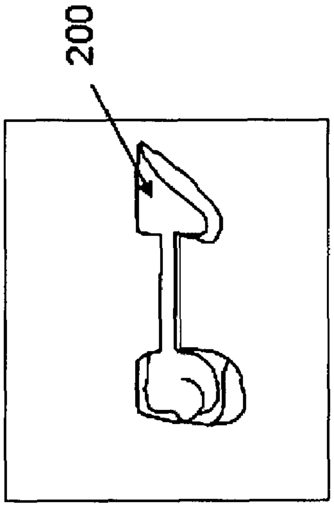
FIGS. 1*h* and 1*i* show the sample before and after the sample is thinned to a desired carbon nanotube collimator channel length and the surface is cleaned.
Figure 1H:
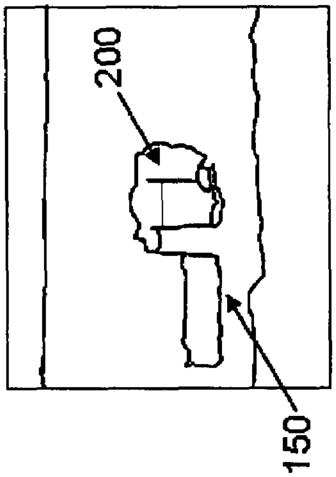
Figure 1G:
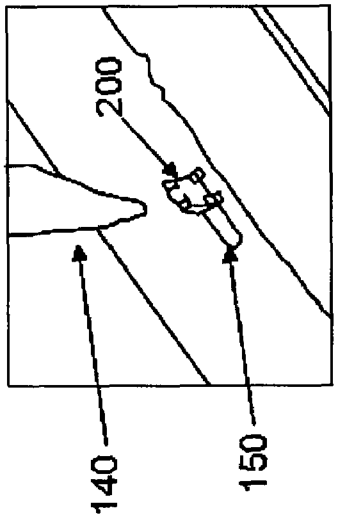
FIG. 1*g* shows the needle of the micromanipulator disconnected from the sample.

In the next step, the CNT collimator sample 200 is disconnected from the micro-manipulator needle 140. FIG. 1*g* shows the needle of the micromanipulator disconnected from the CNT collimator sample 200. The CNT collimator sample 200 is further thinned down to the desired CNT collimator channel length as shown in FIG. 1*h* and the surface is cleaned with low ion beam current to produce the CNT collimator shown in FIG. 1*i*.

In the preferred embodiment, the TEM grid 150 with the CNT collimator 200 attached is then transferred to Technai F30 from FEI company for electron channeling measurement. The transmission electron microscope is a perfect high-end analytical laboratory tool with excellent and versatile capabilities for high resolution imaging as well as extremely good analytical performance. Electron microscopy is the primary method used to determine structure and chemistry of structural features such as interfaces or dislocations. The electron energy is set at approximately 300 keV, the electron beam is unfocused with a divergence of 1 mrad and the beam spot size is in a range between approximately 3 μm to approximately 4 μm.

Figure 2C:
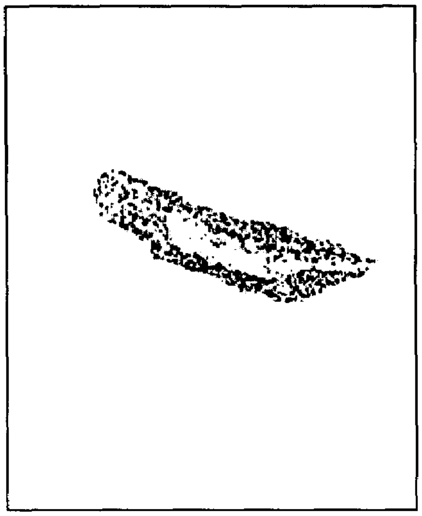
FIG. 2*c* shows, under transmission electron microscope observation, yet another example of the electron channeling through a CNT collimator according the present invention.
Figure 2B:
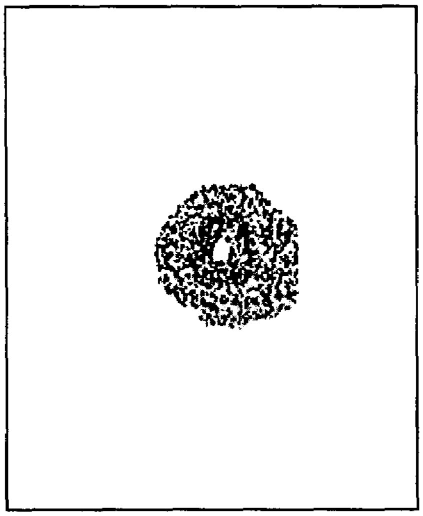
FIG. 2*b* shows, under transmission electron microscope observation, another example of the electron channeling through a CNT collimator according the present invention.
Figure 2A:
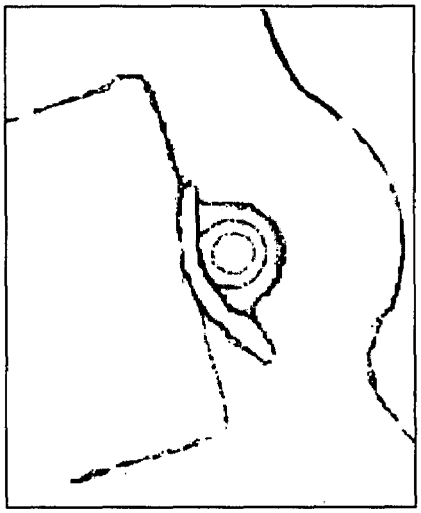
FIG. 2*a* shows, under transmission electron microscope observation, an example of the electron channeling through a CNT collimator according the present invention.

As shown in FIGS. 2*a*, 2*b* and 2*c*, under the TEM observation the channeling of electrons through the CNT is clearly seen. When the CNT collimator sample is tilted approximately 5° from the aligned direction, the hollow core of CNT collimator 200 is also seen as shown in FIG. 2*a*. The inner diameter of this CNT collimator sample shown in FIGS. 2*a*, 2*b* and 2*c* is approximately 20 nm.

Figure 3C:
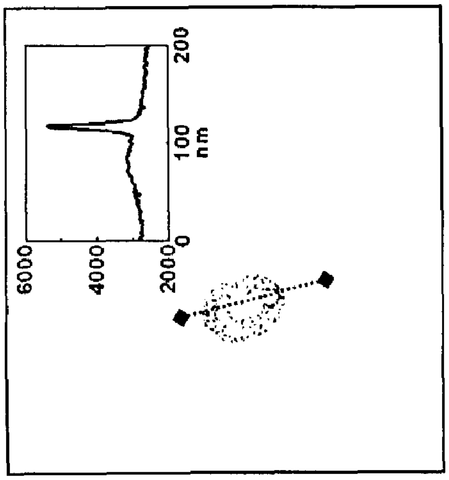
FIG. 3*c* shows yet another example of the electron channeling through a 3 μm F-CNT collimator according the present invention.
Figure 3B:
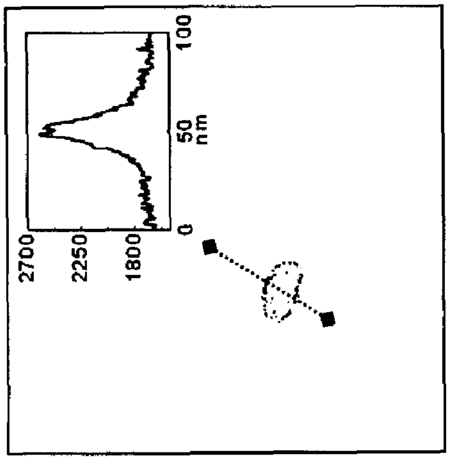
FIG. 3*b* shows another example of the electron channeling through a 3 μm F-CNT collimator according the present invention.
Figure 3A:
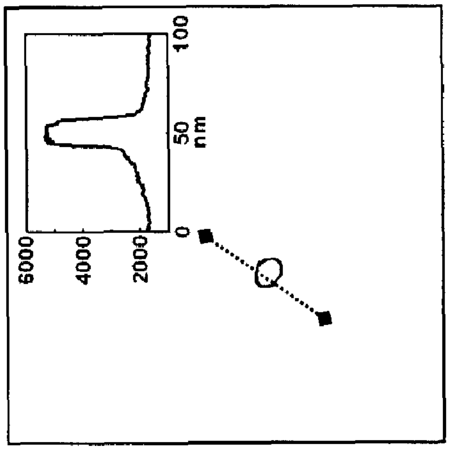
FIG. 3*a* shows an example of the electron channeling through a 3 μm F-CNT collimator according the present invention.

FIGS. 3*a*, 3*b* and 3*c* show examples the electron channeling through a 3 μm F-CNT. The intensity of the electrons propagating through the 3 μm F-CNT is about twice as high as the intensity of electron travel through vacuum as shown in FIG. 3*a*.

In another example, when the TEM grid and attached F-CNT collimator is tilted by approximately 1 degree, direct transmission at this incident angle is prohibited and the intensity of transmitted electrons is reduced by about a factor of five and the beam profile becomes triangular as shown in FIG. 3*b*.

When the beam is under-focused by approximately 2 μm from the Gaussian focus condition, electrons that travel through the F-CNT channel were found to focus to a spot with a diameter of approximately 6 nm as shown in FIG. 3*c*.

The F-CNT structure makes the alignment of the CNT core straightforward by manipulating the micron size carbon fiber. The fiber shield also provides protection for the incident beam damage to the CNT from the focused ion beam (FIB) fabrication process. Unfocused electron beams are successfully propagated through the CNT collimators in a conventional TEM instrument as described in a paper by Chai G., Heinrich H., Chow L., & Schenkel T., submitted to Science (2007). The Fresnel diffraction phenomenon was observed and by tilting the F-CNT package with 1 degree the CNT channel is optically blocked. However, some electron transmission through the CNT core was observed, clear evidence of the electron channeling through the CNT column.

The demonstration of efficient electron transport through a single, micrometer long, and well aligned carbon nanotube has the potential to realize new classes of collimators and beam optics for energetic particles—ions as described in Persaud A., Park S. J., Liddle J. A., Rangelow I. W., Bokor J., & Schenkel T. NanoLetters 5, 1087 (2005), as well as electrons. The use of fiber coated carbon nanotubes makes the handling of single tubes robust and compatible with standard micromanipulation techniques, and testing that a tube is really open with widely available TEMs enables transmission and material transport experiments through CNTs with much higher rates of reproducibility and less frustration then previously possible.

In summary, the present invention provides new apparatus, methods, systems and devices to fabricate individual CNT collimators. The micron size fiber coated CNT samples are synthesized using a chemical vapor deposition method and the individual CNT collimators were fabricated with focused ion beam technique. Unfocused electron beams are successfully propagated through the CNT collimators. These CNT nano-collimators may have important applications in single ion implantation and in high-energy physics, and may allow rapid, reliable testing of the transmission of CNT arrays for transport of molecules.

Individual CNT collimators are used for applications such as single ion implantation and in high-energy physics, and may allow rapid, reliable testing of the transmission of CNT arrays for transport of molecules; as nano-aperture for single ion implementation for quantum computers; applications where a narrow, well-collimated beam of charged particles is required; and for application in high energy physics including $e^{-}$-$e^{+}$ collision or $p^{-}$-$p^{+}$ collision experiments.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A method for producing a carbon nanotube collimator comprising the steps of:
- providing a fiber coated carbon nanotube on a substrate;
- detaching the carbon nanotube from the substrate to produce a CNT collimator;
- moving the detached CNT collimator to a transmission electron microscopy grid using a micro-manipulator;
- attaching the CNT collimator to the transmission electron microscopy grid;
- using a low ion beam current to thin the CNT collimator to a predetermined CNT collimator channel length; and
- using the low ion beam current to clean a surface of the CNT collimator, wherein the CNT collimator is used for applications where a narrow, well-collimated beam of charged particles is required.

2. The method of claim 1, wherein the fiber coated carbon nanotube sample provision step comprises the step of:
- identifying a fiber having a carbon nanotube core on the substrate; and
- using focused ion beam induced chemical vapor disposition to deposit a platinum metal on the fiber coated carbon nanotube to stabilize the fiber coated carbon nanotube.

3. The method of claim 2, wherein the CNT collimator detachment step comprises the steps of:
- partially detaching the metal coated fiber coated carbon nanotube from the substrate;
- attaching a micro-manipulator needle to the metal coated fiber coated carbon nanotube; and
- detaching the metal coated fiber coated carbon nanotube from the substrate to produce the CNT collimator.

4. The method of claim 3, wherein the step of attaching comprises the step of:
- moving the detached CNT collimator to a transmission electron microscopy grid using a micro-manipulator;
- aligning a normal direction of the transmission electron microscopy grid with the CNT collimator;
- depositing a metal to secure the CNT collimator on the transmission electron microscopy grid; and
- detaching the a micro-manipulator needle from the CNT collimator.

5. The method of claim 1, further comprising the step of:
- using the carbon nanotube collimator for nano-aperture for single ion implementation.

6. The method of claim 1, further comprising the step of:
- using the CNT collimator for single ion implantation for quantum computers.

7. The method of claim 1, further comprising the step of:
- using the CNT collimator for high-energy physics including $e^{-}$-$e^{+}$ collision and $p^{-}$-$p^{+}$ collision.

8. The method of claim 1, further comprising the step of:
- using the CNT collimator for rapid, reliable testing of the transmission of CNT arrays for transport of molecules.

9. The method of claim 1, further comprising the step of:
- measuring electron channeling of the CNT collimator.

10. The method of claim 9, wherein the measurement step comprises the steps of:
- transferring the CNT collimator to a measuring device, wherein the CNT collimator is attached to the transmission electron microscopy grid;
- setting an electron energy on the measuring device; and
- observing channeling of electrons through CNT under TEM observation.

11. The method of claim 10, wherein the electron energy is set at 300 keV, an electron beam is unfocused with a divergence of approximately 1 mrad and a beam spot size is within a range of approximately 3 μm to approximately 4 μm.

12. The method of claim 10, further comprising the step of:
- tilting the CNT collimator approximately 5% from the aligned direction to view a hollow core of the CNT under transmission electron microscopy.

13. The method of claim 10, further comprising the step of:
- tilting the CNT collimator approximately one degree to reduce an intensity of a of transmitted electrons and produce a beam having a triangular profile.

* * * * *